United States Patent
Tsai et al.

(10) Patent No.: US 11,430,906 B2
(45) Date of Patent: Aug. 30, 2022

(54) OPTICAL DEVICE INCLUDING LID HAVING FIRST AND SECOND CAVITY WITH INCLINED SIDEWALLS

(71) Applicant: Advanced Semiconductor Engineering, Inc., Kaohsiung (TW)

(72) Inventors: Chang Chin Tsai, Kaohsiung (TW); Yu-Che Huang, Kaohsiung (TW); Hsun-Wei Chan, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 294 days.

(21) Appl. No.: 16/518,792

(22) Filed: Jul. 22, 2019

(65) Prior Publication Data

US 2020/0035851 A1 Jan. 30, 2020

Related U.S. Application Data

(60) Provisional application No. 62/703,787, filed on Jul. 26, 2018.

(51) Int. Cl.
*H01L 31/12* (2006.01)
(52) U.S. Cl.
CPC .................... *H01L 31/125* (2013.01)
(58) Field of Classification Search
CPC .. H01L 31/125; H01L 31/167; H01L 31/0203
See application file for complete search history.

(56) References Cited

U.S. PATENT DOCUMENTS

| | | | |
|---|---|---|---|
| 2008/0087824 A1* | 4/2008 | Hayashi | G01J 1/04 250/338.1 |
| 2011/0147573 A1 | 6/2011 | Liess et al. | |
| 2012/0228503 A1 | 9/2012 | Nishikawa et al. | |
| 2014/0117201 A1 | 5/2014 | Barlow | |
| 2016/0146639 A1 | 5/2016 | Chan | |
| 2017/0113922 A1* | 4/2017 | Huang | B81B 7/0067 |
| 2018/0087958 A1 | 3/2018 | Shen et al. | |

FOREIGN PATENT DOCUMENTS

| | | |
|---|---|---|
| CN | 101952698 A | 1/2011 |
| CN | 102412336 A | 4/2012 |
| TW | 201133778 A1 | 10/2011 |
| TW | 201135954 A1 | 10/2011 |
| TW | 201323841 A1 | 6/2013 |
| TW | 201814321 A | 4/2018 |

OTHER PUBLICATIONS

Office Action for corresponding Taiwanese Patent Application No. 108126596, dated Jun. 30, 2022, 11 pages.
Search Report (with English translation) for corresponding Taiwanese Patent Application No. 108126596, dated Jun. 30, 2022, 4 pages.

* cited by examiner

*Primary Examiner* — Matthew E. Gordon
(74) *Attorney, Agent, or Firm* — Foley & Lardner LLP

(57) ABSTRACT

An optical device includes a substrate, an electronic component and a lid. The electronic component is disposed on the substrate. The lid is disposed on the substrate. The lid has a first cavity over the electronic component and a second cavity over the first cavity. The sidewall of the second cavity is inclined.

17 Claims, 6 Drawing Sheets

OPTICAL DEVICE INCLUDING LID HAVING FIRST AND SECOND CAVITY WITH INCLINED SIDEWALLS

CROSS-REFERENCE TO RELATED APPLICATIONS

This application claims the benefit of and priority to U.S. Provisional Application No. 62/703,787, filed on Jul. 26, 2018, the contents of which are incorporated herein by reference in their entirety.

BACKGROUND

1. Technical Field

The present disclosure relates to an optical device, and more particularly to an optical device including a lid.

2. Description of the Related Art

In an optical device (e.g., light scanning sensor, distance finding sensor, background-light sensing system), light emitters (e.g., vertical-cavity surface-emitting LASER (VCSEL) or light emitting diodes (LED)) and/or light detectors are used. In some optical devices, a lid may be used to protect the light emitter and/or light detector. The lid has one or more openings to expose the light emitting area of the light emitter or the light detecting area of the light detector. It is desirable to provide an optical device having a lid, which can provide a better optical performance without increasing the size of the optical device.

SUMMARY

In accordance with an aspect of the present disclosure, an optical device includes a substrate, an electronic component and a lid. The electronic component is disposed on the substrate. The lid is disposed on the substrate. The lid has a first cavity over the electronic component and a second cavity over the first cavity. The sidewall of the second cavity is inclined.

In accordance another aspect of the present disclosure, an optical device includes a substrate, an electronic component and lid. The electronic component is disposed on the substrate. The lid is disposed on the substrate. The lid has a first cavity over the electronic component and a second cavity over the first cavity. The lid has a top surface facing away from the substrate. The top surface of the lid and a sidewall of the second cavity define an angle greater than 90 degrees.

Figure 1A:
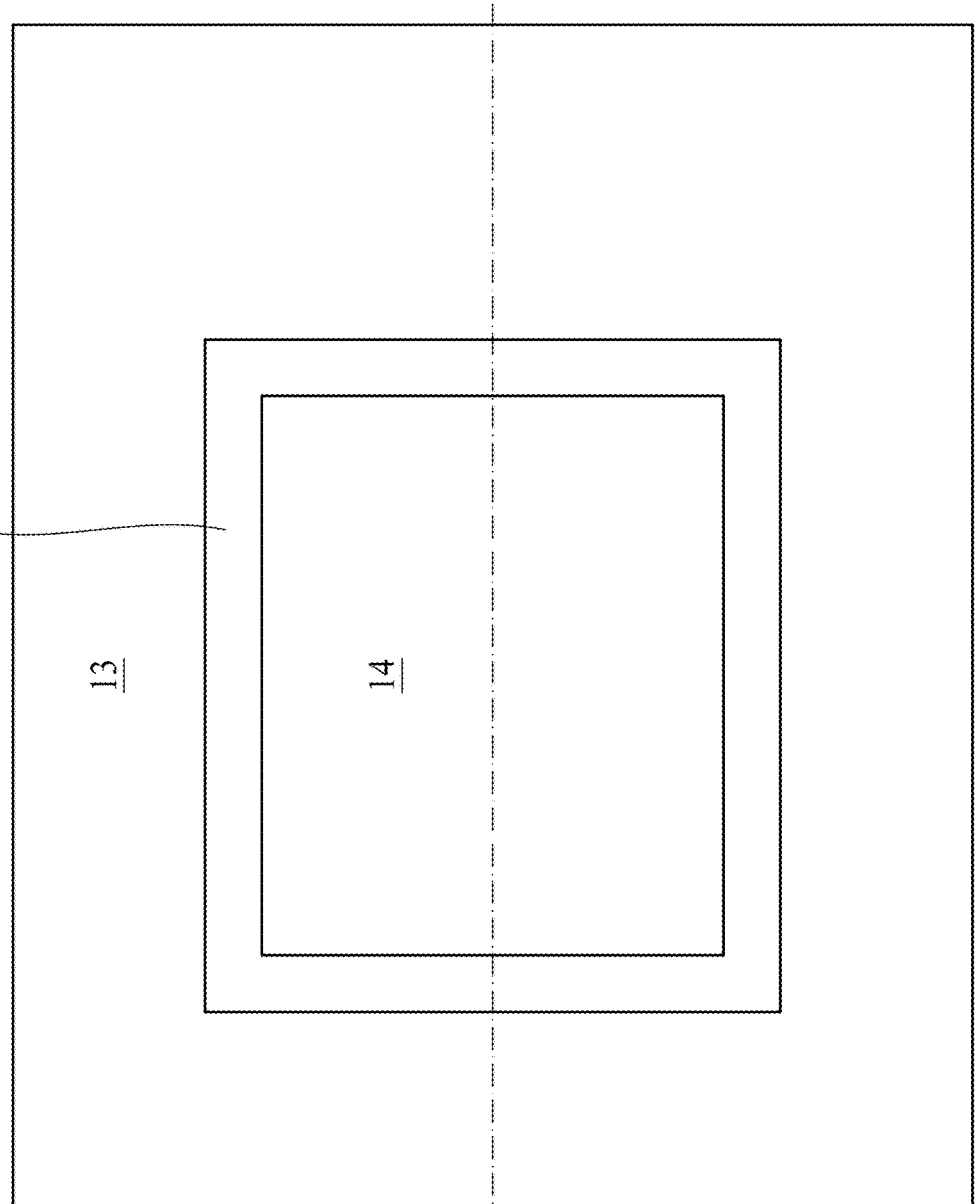
FIG. 1A illustrates a top view of an optical device in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

Figure 1B:
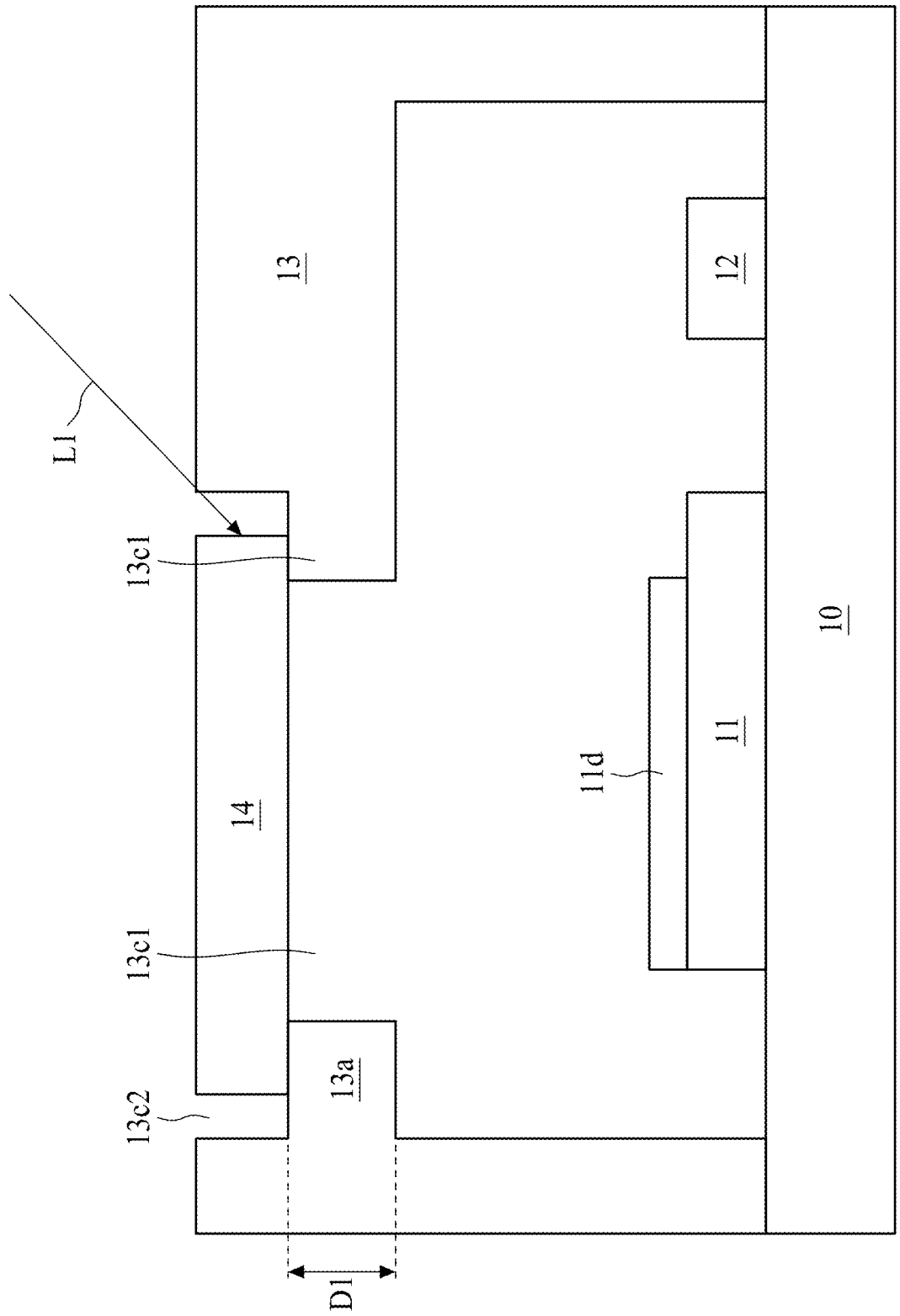
FIG. 1B illustrates a cross-sectional view of an optical device in accordance with some embodiments of the present disclosure.

FIG. 1A illustrates a top view of an optical device 1 in accordance with some embodiments of the present disclosure. FIG. 1B illustrates a cross-sectional view of the optical device 1 in FIG. 1A taken along the line A-A', in accordance with some embodiments of the present disclosure. The optical device 1 includes a substrate 10, electronic components 11 and 12, a lid 13 and a light transmission element 14. In some embodiments, the optical device 1 may be or include a light scanning sensor, a distance finding sensor, a background-light sensing system, a time of flight (ToF) sensor or an ambient light sensor (ALS).

The substrate 10 may include, for example, a printed circuit board, such as a paper-based copper foil laminate, a composite copper foil laminate, or a polymer-impregnated (p.p.) glass-fiber-based copper foil laminate. The substrate 10 may include an interconnection structure, such as a plurality of conductive traces, pads or through vias. In some embodiments, the substrate 10 includes a ceramic material or a metal plate. In some embodiments, the substrate 10 may include an organic substrate or a leadframe. In some embodiments, the substrate 10 may include a two-layer substrate which includes a core layer and a conductive material and/or structure disposed on an upper surface and a bottom surface of the substrate 10. The conductive material and/or structure may include a plurality of traces, pads, or vias.

The electronic component 11 is disposed on the substrate 10 and connected to the substrate 10 for example, by way of flip-chip or wire-bond techniques. In some embodiments, the electronic component 11 is a light detector having a light sensing area 11*d* facing the light transmission element 14 to receive the light passing through the light transmission element 14. In some embodiments, the light detector may include, for example, a PIN diode (a diode including a p-type semiconductor region, an intrinsic semiconductor region, and an n-type semiconductor region) or a photo-diode or a photo-transistor. In some embodiments, the electronic component 11 can be a microelectromechanical system (MEMS) with the light sensing area 11*d* thereon. In some embodiments, the electronic component 11 can be a light emitter (e.g., a light-emitting diode (LED), a laser diode, a vertical-cavity surface-emitting Laser (VCSEL) and the like).

The electronic component 12 is disposed on the substrate 10 and connected to the substrate 10 for example, by way of flip-chip or wire-bond techniques. In some embodiments, the electronic component 12 may include a controller, a processor, a memory, an application-specific integrated circuit (ASIC) and the like. The electronic component 12 is configured to receive signal from the electronic component 11 and to process the received signal. In other embodiments, the electronic components 11 and 12 can be integrated into a single die/chip depending on different design specifications.

The lid (or housing) 13 is disposed on the substrate 10. The lid 13 defines a cavity (or opening, aperture) 13*c*1 over the light sensing area 11d of the electronic component 11. The lid 13 further defines a cavity 13c2 over the cavity 13c1. In some embodiments, a width of the cavity 13c2 is greater than a width of the cavity 13c1. In some embodiments, the width of the cavity 13c1 is equal to or greater than the light sensing area 11d. The lid 13 has a support structure 13a to support the light transmission element 14. In some embodiments, the cavity 13c1 is defined by the support structure 13a.

The light transmission element 14 is disposed within the cavity 13c2 and on the support structure 13a. The light transmission element 14 is configured to allow light with desired wavelength (color) or desired ranges of wavelengths (colors) passing through. In some embodiments, the light transmission element 14 is a light filter to remove (e.g., reflect or absorb) an undesired wavelength or undesired ranges of wavelengths of light. In some embodiments, the light transmission element 14 may include a glass or plastic with a coating thereon.

Figure 2:
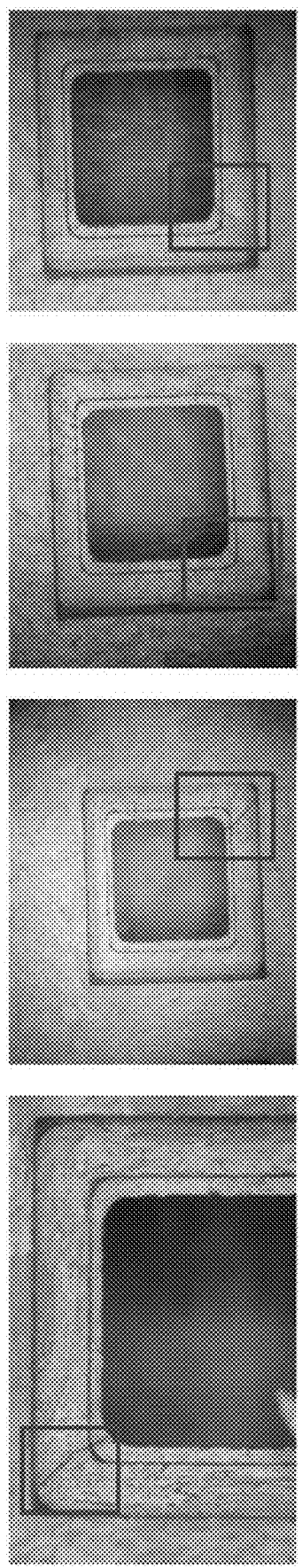
FIG. 2 are images of an optical device in accordance with some embodiments of the present disclosure.

In some embodiments, the thickness of the support structure 13a of the lid 13 is constrained. For example, if the support structure 13a is too thin (e.g., less than 300 micrometer (μm)), the lid 13 may be damaged or crack (as shown in FIG. 2, which shows photos of the optical device 1) during or after reflow process, which may cause a cross-talk issue. For example, undesired light may enter the light sensing area 11d through the crack of the lid 13, which will decrease the signal-to-noise ratio (SNR) of the optical device 1. Therefore, to avoid the crack of the lid 13, a relatively thick support structure 13a is included. However, this will increase the total thickness of the optical device 1, which would hinder the miniaturization of the optical device 1.

In addition, an adhesive (e.g., glue or tape) between the light transmission element 14 and the support structure 13a is included to fasten or fix the light transmission element 14 to the support structure 13a. However, since the adhesive may be uneven, a tilt of the light transmission element 14 would occur. Furthermore, the coating is applied to a top surface, a bottom surface or both surfaces of the light transmission element 14 but is not applied to a lateral surface of the light transmission element after singulation. Therefore, the light may enter the light sensing area 11d through the light path L1, which will decrease the SNR of the optical device 1.

Figure 3A:
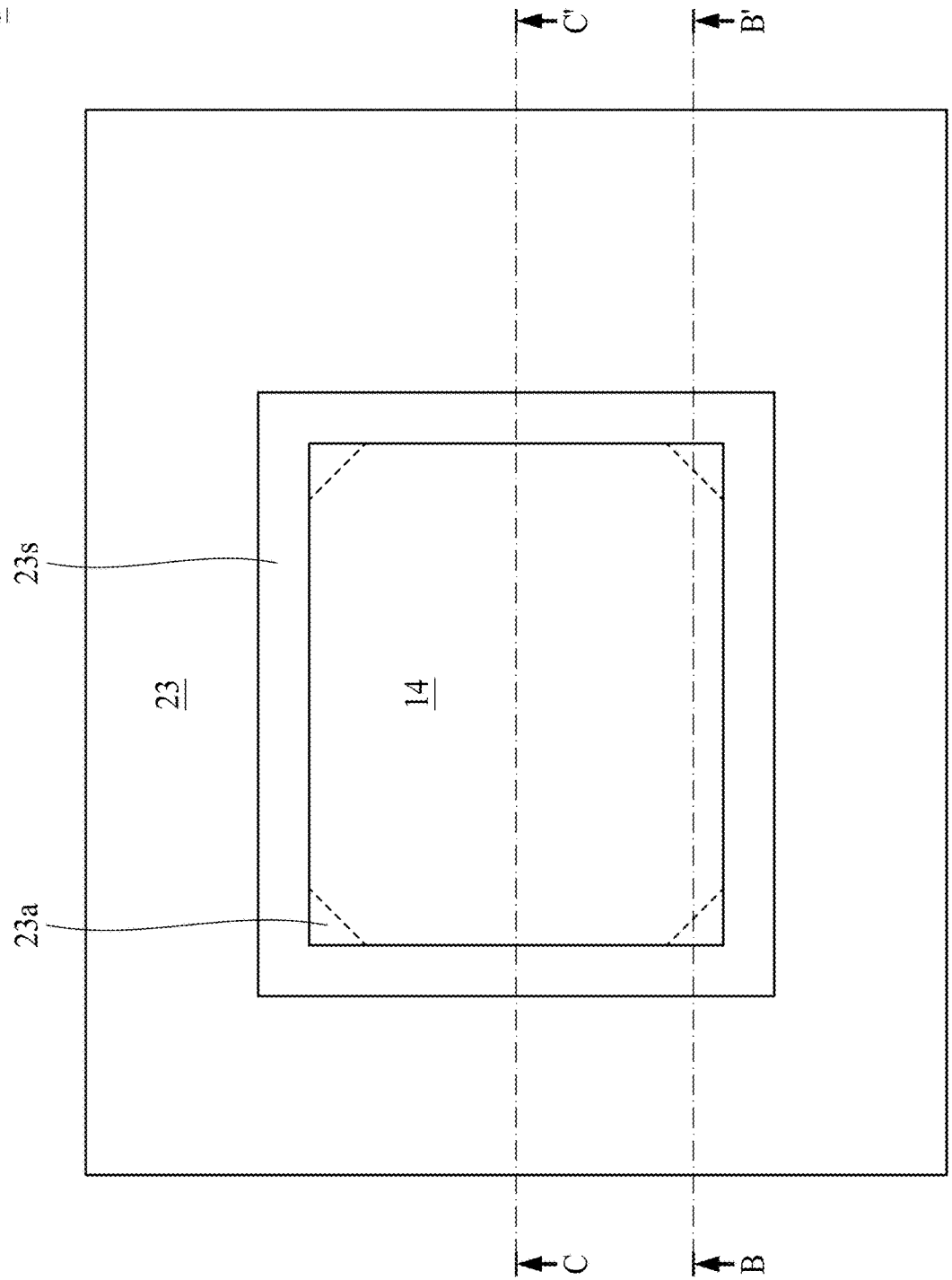
FIG. 3A illustrates a top view of an optical device in accordance with some embodiments of the present disclosure.
Figure 3B:
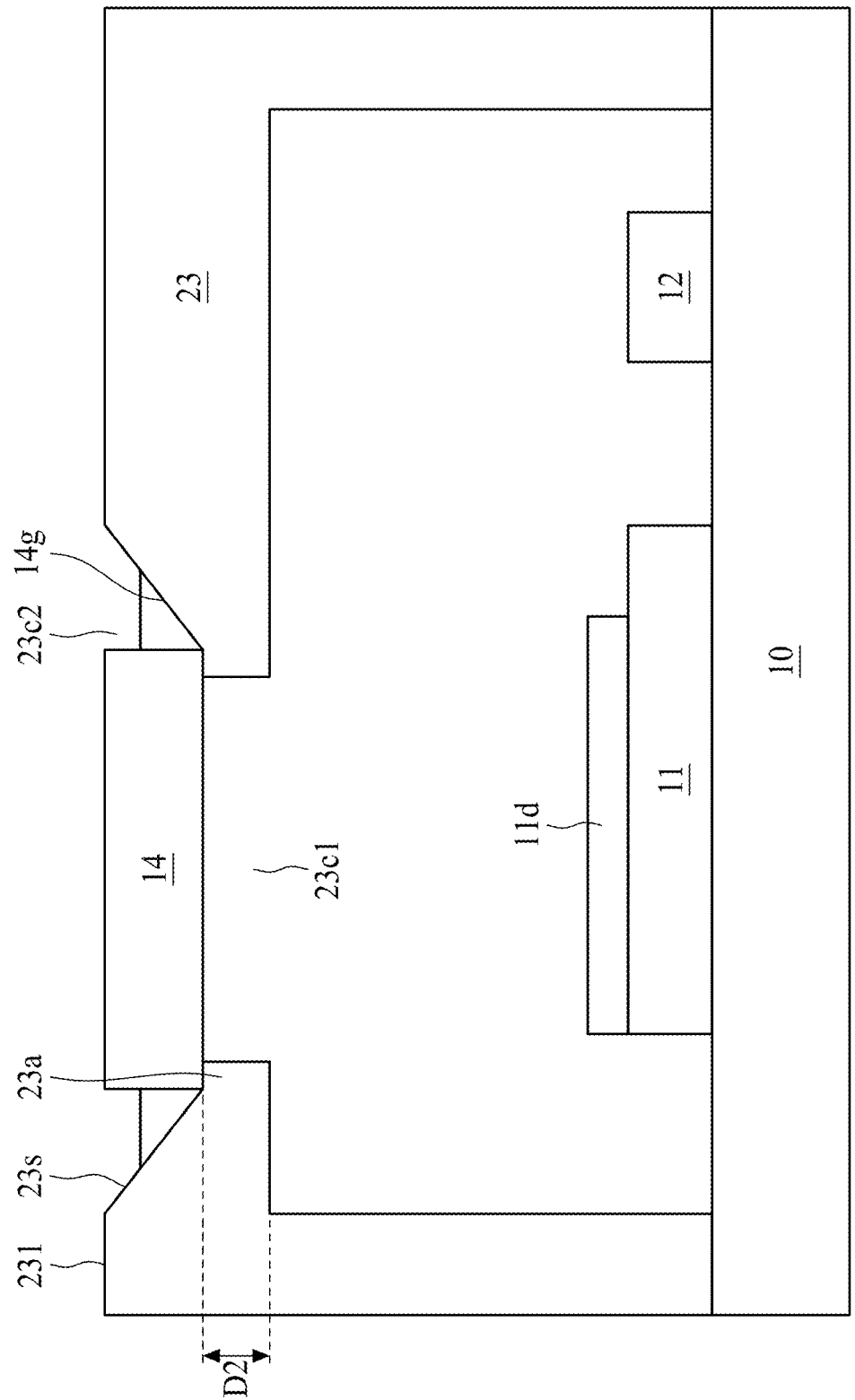
FIG. 3B illustrates a cross-sectional view of an optical device in accordance with some embodiments of the present disclosure.
Figure 3C:
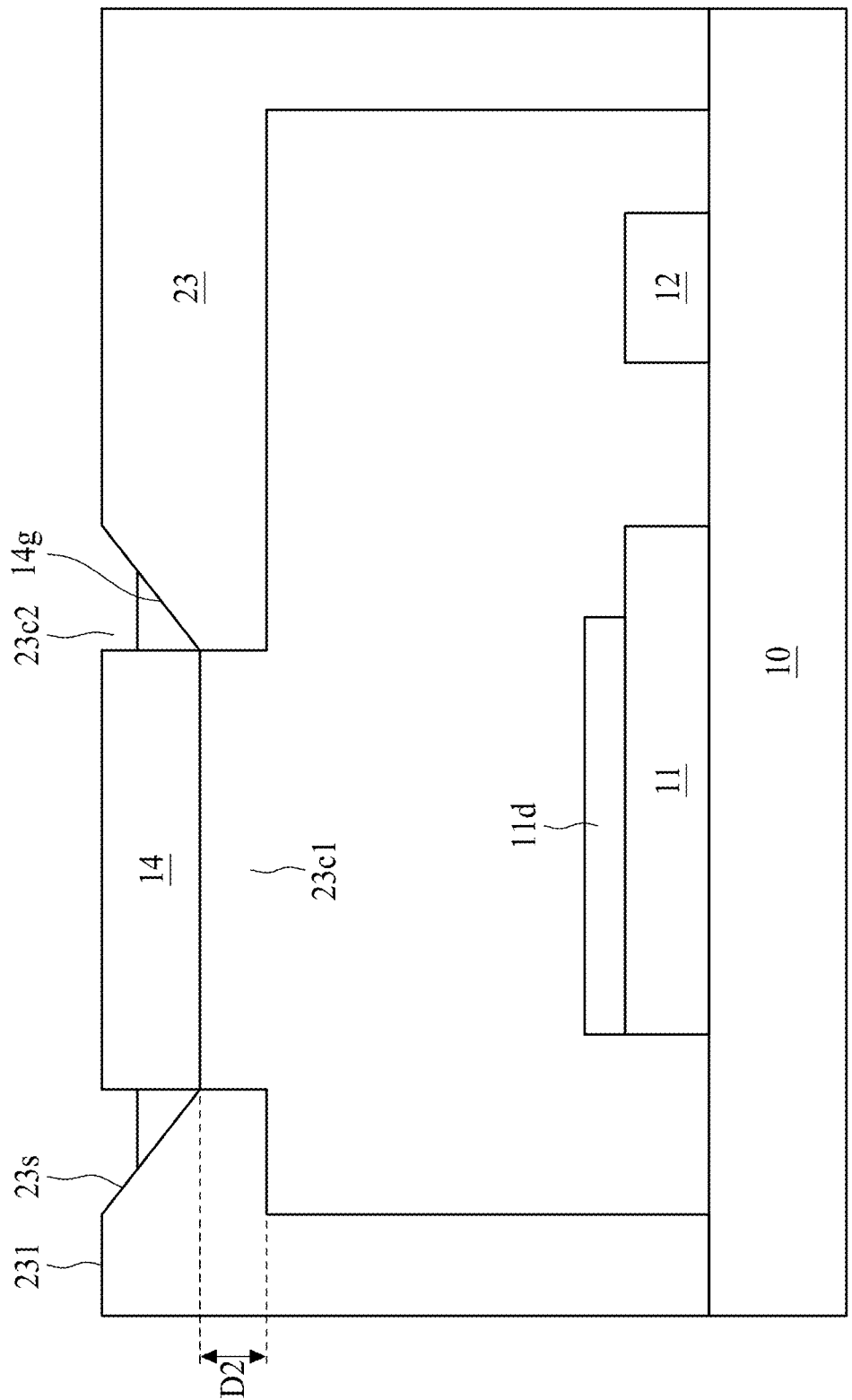
FIG. 3C illustrates a cross-sectional view of an optical device in accordance with some embodiments of the present disclosure.

FIG. 3A illustrates a top view of an optical device 3 in accordance with some embodiments of the present disclosure. FIG. 3B illustrates a cross-sectional view of the optical device 3 in FIG. 3A taken along the line B-B' and FIG. 3C illustrates a cross-sectional view of the optical device 3 in FIG. 3A taken along the line C-C', in accordance with some embodiments of the present disclosure. The optical device 3 illustrated in FIGS. 3A, 3B and 3C is similar to the optical device 1 illustrated in FIGS. 1A and 1B, and the differences therebetween are described below.

As shown in FIGS. 3A, 3B and 3C, a lid 23 of the optical 3 includes a slope 23s (or a lateral surface) connecting a top surface 231 of the lid 23 with the support structure 23a of the lid 23. The lid 23 defines a cavity (or opening, aperture) 23c1 over the light sensing area 11d of the electronic component 11. The lid 23 further defines a cavity 23c2 over the cavity 23c1. The sidewall (e.g., the slope 23s) of the cavity 23c2 is inclined. For example, the cavity 23c2 tapers from the top surface 231 of the lid 23 toward the cavity 23c1. For example, the top surface 231 of the lid 23 and the sidewall of the cavity 23c2 define an angle greater than 90 degrees. For example, the sidewall of the cavity 23c2 is not perpendicular to the top surface 231 of the lid 23. For example, the sidewall of the cavity 23c2 is not parallel to the sidewall of the cavity 23c1. The sidewall of the cavity 23c2 defines a guiding structure. In some embodiments, a width of the cavity 23c2 is greater than a width of the cavity 23c1. In some embodiments, as shown in FIG. 3A, the support structure 23a is disposed at or adjacent to the corners of the cavity 23c1. For example, the support structure 23a is not disposed along the whole edges of the cavity 23c1. For example, as shown in FIG. 3C, which illustrates a cross-sectional view of the optical device 3 in FIG. 3A taken along the line C-C' (passing the center of the edges of the cavity 23c1), the support structure 23a is omitted.

The light transmission element 14 is disposed within the cavity 23c2 and on the support structure 23a of the lid 23. A glue 14g is disposed between the light transmission element 14 and the slope 23s of the lid 23 to fasten or adhere the light transmission element 14 to the lid 23. In some embodiments, the glue 14g is disposed along the slope 23s of the lid 23. In some embodiments, the glue 14g is formed of or includes light absorbing materials or light reflection materials. The guiding structure (e.g., the slope 23s) of the lid 23 can facilitate the injection of the glue 14g. Since there is no adhesive between the light transmission element 14 and the support structure 23a of the lid 23 (e.g., the light transmission element 14 is in contact with the support structure 23a), the tilt issue of the optical device 1 illustrated in FIGS. 1A and 1B can be eliminated. In addition, the lateral surface of the light transmission element 14 is covered (partially or fully) by the glue 14g, which would avoid the light from entering the light sensing area 11d through the lateral surface of the light transmission element 14.

In addition, as shown in FIGS. 3A, 3B and 3C, since the support structure 13a of the lid 13, which surrounds the cavity 13c1 as illustrated in FIGS. 1A and 1B is replaced by the guiding structure 23s, the difficulty or complexity for forming the lid 23 (which is formed by, for example, injection molding) can be reduced. Moreover, the thickness D2 of the support structure 23a can be reduced (e.g., from 300 μm to 200 μm or less) without the occurrence of the crack, which will facilitate the miniaturization of the optical device 3.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within 50 μm of lying along a same plane, such as within 40 μm, within 30 μm, within 20 μm, within 10 μm, or within 1 μm of lying along the same plane. Two components can be deemed to be "substantially aligned" if, for example, the two components overlap or are within 200 μm, within 150 μm, within 100 μm, within 50 μm, within 40 μm, within 30 μm, within 20 μm, within 10 μm, or within 1 μm of overlapping. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An optical device, comprising:
a substrate;
an electronic component disposed on the substrate; and
a lid disposed on the substrate, the lid having a first cavity over the electronic component and a second cavity over the first cavity,
wherein the lid comprises a support structure spaced apart from an adhesive material;
the first cavity comprises a first sidewall and a second sidewall adjacent to the first sidewall, and wherein the support structure has a surface extending between the first sidewall and the second sidewall;
the support structure comprises a plurality of parts, each of the plurality of parts is disposed on each corner of the first cavity; and
the plurality of parts is physically separated from one another, wherein a bottom surface of the support structure is physically separated from a top surface of the substrate.

2. The optical device of claim 1, further comprising a light filter disposed within the second cavity and the adhesive material is disposed between the light filter and a sidewall of the second cavity.

3. The optical device of claim 1, wherein a projection area of the support structure on the substrate and a projection area of the adhesive material on the substrate are non-overlapped with each other.

4. The optical device of claim 3, wherein the adhesive material has a substantially triangular shape from a cross-sectional view.

5. The optical device of claim 2, wherein a projection area of the light filter on the substrate and a projection area of the adhesive material on the substrate are non-overlapping.

6. The optical device of claim 5, wherein a lower surface of the light filter facing the support structure is exposed from the adhesive material.

7. The optical device of claim 6, wherein the support structure is disposed adjacent to at least one of corners of the first cavity without extending along an edge connecting two adjacent corners of the first cavity.

8. The optical device of claim 7, wherein an edge of the lower surface of the light filter is exposed from the support structure.

9. The optical device of claim 8, wherein a projection area of the light filter on the substrate is entirely within a boundary of a projection area of the support structure on the substrate.

10. The optical device of claim 8, wherein the support structure has a top surface, and the bottom surface is opposite to the top surface, and a lateral surface extending between the top surface and the bottom surface, and wherein the lateral surface is substantially perpendicular with the bottom surface.

11. The optical device of claim 10, wherein the support structure has a portion in contact with the light filter, and the portion of the support structure has a substantially constant thickness in a cross-sectional view.

12. An optical device, comprising:
a substrate;
an electronic component disposed on the substrate; and
a lid disposed on the substrate, the lid having a first cavity over the electronic component and a second cavity over the first cavity;
wherein the lid comprises a support structure angled with a sidewall of the second cavity, and the support structure is disposed adjacent to at least one of corners of the first cavity without extending along an edge connecting two adjacent corners of the first cavity;
the first cavity comprises a first sidewall and a second sidewall adjacent to the first sidewall, and wherein the support structure has a surface extending between the first sidewall and the second sidewall;
the support structure comprises a plurality of parts, each of the plurality of parts is disposed on each of the corners of the first cavity; and
the plurality of parts is physically separated from one another, wherein a bottom surface of the support structure is physically separated from a top surface of the substrate.

13. The optical device of claim 12, wherein the support structure has a substantially triangular shape in a top view.

14. The optical device of claim 12, wherein the support structure has a lower surface facing the substrate and an upper surface opposite to the lower surface, and wherein the upper surface is substantially parallel to the lower surface.

15. The optical device of claim 14, wherein the support structure further has a lateral surface extending between the lower surface and the upper surface, and wherein the lateral surface is substantially perpendicular to the lower surface.

16. The optical device of claim 15, wherein the upper surface, the lower surface, and a surface of the substrate on which the electronic component is disposed are substantially parallel.

17. The optical device of claim 15, wherein the support structure has a substantially constant thickness in a cross-sectional view.

* * * * *